(12) United States Patent
Huster et al.

(10) Patent No.: US 6,391,767 B1
(45) Date of Patent: May 21, 2002

(54) DUAL SILICIDE PROCESS TO REDUCE GATE RESISTANCE

(75) Inventors: Carl Robert Huster, San Jose;
Concetta Riccobene, Mountain View;
Wei Long, Sunnyvale, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/501,994

(22) Filed: Feb. 11, 2000

(51) Int. Cl.[7] .......................................... H01L 21/4763
(52) U.S. Cl. ...................................... 438/630; 438/655
(58) Field of Search ................................ 438/180, 229, 438/230, 231, 232, 233, 301, 305, 306, 630, 655

(56) References Cited

U.S. PATENT DOCUMENTS

| | | | | |
|---|---|---|---|---|
| 5,084,417 A | * | 1/1992 | Joshi et al. ................. | 438/653 |
| 5,352,631 A | * | 10/1994 | Sitaram et al. ............. | 438/303 |
| 5,723,893 A | * | 3/1998 | Yu et al. ..................... | 257/413 |
| 5,856,225 A | * | 1/1999 | Lee et al. ................... | 438/291 |
| 5,953,616 A | * | 9/1999 | Ahn ............................ | 438/305 |
| 6,037,204 A | * | 3/2000 | Chang et al. ............... | 438/231 |
| 6,063,681 A | * | 5/2000 | Son ............................. | 438/303 |
| 6,180,469 B1 | * | 1/2001 | Pramanick et al. ......... | 438/299 |
| 6,200,871 B1 | * | 3/2001 | Moslehi ...................... | 438/303 |
| 6,225,176 B1 | * | 5/2001 | Yu .............................. | 438/305 |

* cited by examiner

*Primary Examiner*—David Nelms
*Assistant Examiner*—David Nhu

(57) ABSTRACT

A method of reducing the gate resistance in a semiconductor device forms a gate in the semiconductor device followed by the creation of a silicide region on top of the gate. During the initial formation of the silicide region on the gate, formation of silicide on source/drain areas of the semiconductor device is prevented by a shielding material. The shielding material is then removed and additional silicide is created, forming silicide regions on the source/drains and increasing the thickness of the silicide over the gate, thereby lowering the gate resistance.

16 Claims, 5 Drawing Sheets

DUAL SILICIDE PROCESS TO REDUCE GATE RESISTANCE

FIELD OF THE INVENTION

The present invention relates to the field of semiconductor device manufacturing, and more particularly, to the formation of low resistivity self-aligned silicide regions on the gate and source/drain junctions of a semiconductor device.

BACKGROUND ART

In the manufacture of integrated circuits, a commonly used practice is to form silicide on source/drain regions and on polysilicon gates. This practice has become increasingly important for very high-density devices where the feature size is reduced to a fraction of a micrometer. Silicide provides good ohmic contact, reduces the sheet resistivity of source/drain regions in polysilicon gates, increases the effective contact area, and provides an etch stop.

A common technique employed in the semiconductor manufacturing industry is self-aligned silicide ("salicide") processing. Salicide processing involves the deposition of a metal that forms intermetallic with silicon (Si) but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$, NiSi. The metal is deposited with a uniform thickness across the entire semiconductor wafer. This is accomplished using, for example physical vapor deposition (PVD) from an ultra-pure sputtering target and a commercially available ultra-high vacuum (UHV), multi-chamber, DC magnetron sputtering system. Deposition is performed after both gate etch and source/drain junction formation. After deposition, the metal blankets the polysilicon gate electrode, the oxide spacers, oxide isolation, and the exposed source and drain electrodes. A cross-section of an exemplary semiconductor wafer during one stage of a salicide formation process in accordance with prior art techniques is depicted in FIG. 1.

As shown in FIG. 1, silicon substrate 10 has been provided with source/drain junctions 12, 14 and a polysilicon gate 16. Oxide spacers 18 have been formed on the sides of the polysilicon gate 16. Refractory metal layer 20, comprising cobalt, for example, has been blanket deposited over the source/drain junctions 12, 14, polysilicon gate 16, and the spacer 18. The metal layer 20 also blankets oxide isolation regions 22 that isolate the devices from one another.

A first rapid thermal anneal (RTA) step is then performed at a temperature of between about 450°–700° C. for a short period of time in a nitrogen atmosphere. The nitrogen reacts with a metal to form a metal nitride at the surface of a metal, while the metal reacts with silicon and forms silicide in those regions where direct contact with the silicon. Hence, the reaction of the metal with the silicon forms a silicide 24 on the gate 16 and source/drain regions 12, 14, as depicted in FIG. 2.

After the first rapid thermal anneal step, any metal that is unreacted is stripped away using a wet etch process that is selective to the silicide. A second, higher temperature rapid thermal anneal step, for example above 700° C., is applied to form a lower resistance silicide phase of the metal silicide. The resultant structure is depicted in FIG. 3 in which the higher resistivity-phase metal silicide 24 has been transformed to the lowest resistivity phase metal silicide 26. For example, when the metal is cobalt, the higher resistivity phase is CoSi and the lowest resistivity phase is $CoSi_2$. When the polysilicon and diffusion patterns are both exposed to the metal, the silicide forms simultaneously over both regions. This method is considered to be a "salicide" method since the silicides formed over the polysilicon and single-crystal silicon are self-aligned to each other.

In cobalt silicide technologies, as in titanium silicide technologies, the silicon is consumed by the reaction to form the silicide. As the industry moves to shallower junctions to increase switching speed of the semiconductor devices, overly large silicon consumption results in insufficient distance between the bottom of the silicide and the bottom of the source/drain junctions, and therefore results in junction leakage. An example of this problem is depicted in prior art FIG. 3. The cobalt silicide regions 26 are depicted as extending to the bottom of the source/drain junctions 12, 14 so as to create junction leakage.

One of the important factors which determine the maximum speed at which a circuit can operate in CMOS technologies is the resistance of the gate. This is the reason that the top of the gate in CMOS technologies is typically converted to a silicide, such as is shown in FIG. 3. The larger the silicide layer, the lower the resistance and the faster the semiconductor device will operate. However, the creation of too much silicide produces the problem of "bridging" between the gate silicide and the source/drain silicides.

BRIEF SUMMARY OF THE INVENTION

There is a need for a method of reducing the gate resistance in a semiconductor device that increases the amount of silicide on the gate without producing a bridging problem between the gate silicide and the source/drain silicides. Also, there is a need for a method of reducing the gate resistance of a semiconductor device without excessive consumption of silicon in the source/drain regions, thereby allowing the formation of ultra-shallow junctions.

These and other needs are met by the present invention which provides a method of reducing gate resistance in a semiconductor device comprising the steps of forming a silicide region only on a gate of a semiconductor device, and forming silicide on a source/drain of the semiconductor device and on the previously formed silicide region.

One of the advantages of the present invention is that the method produces a thicker silicide region only on the gate of the semiconductor device, while the silicide on the source/drain areas of the semiconductor device may remain a conventional thickness. This reduces the possibility of bridging and prevent excessive silicon consumption, while reducing the resistance at the gate.

The earlier stated needs are met by another embodiment of the present invention which provides a method of reducing gate resistance in the semiconductor device, comprising the steps of forming a gate and forming silicide to a first thickness on the gate while simultaneously preventing silicide formation on other portions of the semiconductor device. The thickness of the silicide on the gate is then increased to a second thickness and silicide is simultaneously formed on at least some of the other portions of the semiconductor device.

The formation of silicide on a gate to a first thickness, while simultaneously preventing silicide formation on other portions of the semiconductor device, permits tailoring of the gate resistance without excessive consumption of silicon in the source/drain areas and bridging between the gate and the source/drain silicide regions.

The foregoing and other features, aspects and advantages of the present invention will become more apparent in the following detailed description of the present invention when taken in conjunction with the accompanying drawings.

DETAILED DESCRIPTION OF THE INVENTION

The present invention addresses the problem of reducing the gate resistance in a semiconductor device without increasing the likelihood of bridging and without excessively consuming silicon in the source/drain regions. This is accomplished in certain embodiments of the invention by the formation of the silicide region in a first part of the process only on a gate of the semiconductor device. At the same time the silicide is being formed on the gate, silicide formation on the source/drain regions of the semiconductor device is prevented. In certain embodiments, this is accomplished by shielding the source/drain regions with a shielding material, such as oxide, during the formation of the initial silicide on the gate. After the shielding material is removed from over the source/drain regions, a second silicidation process is performed, with silicide forming on the source/drain regions and on the previously formed gate silicide.

Figure 1:
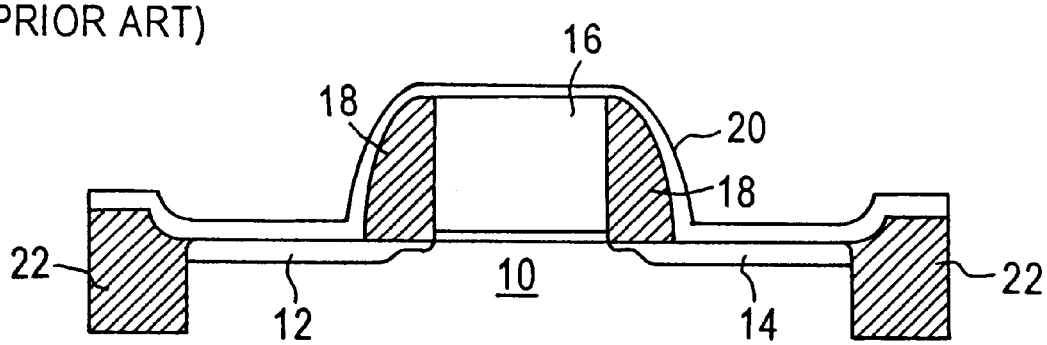
FIG. 1 is a cross-section of a portion of a semiconductor wafer processed in accordance with the prior art during one step of a salicide process.
Figure 2:
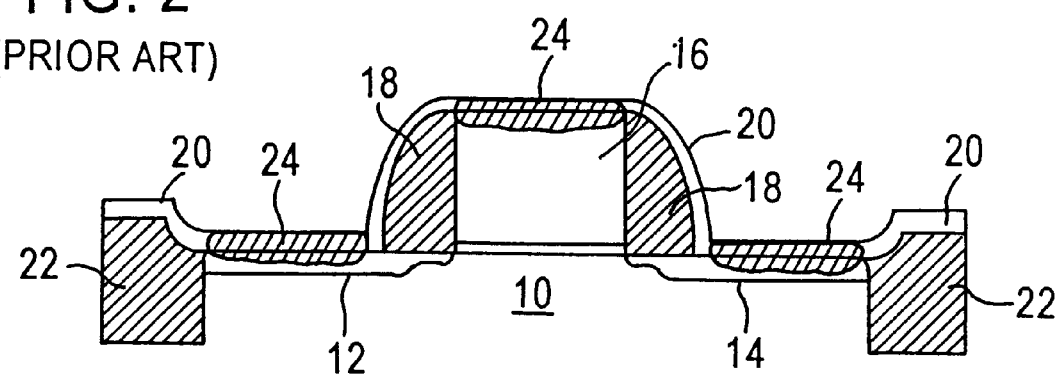
FIG. 2 depicts the cross-section of FIG. 1 after a first rapid thermal anneal step to form high resistivity metal silicide regions in accordance with the prior art.
Figure 3:
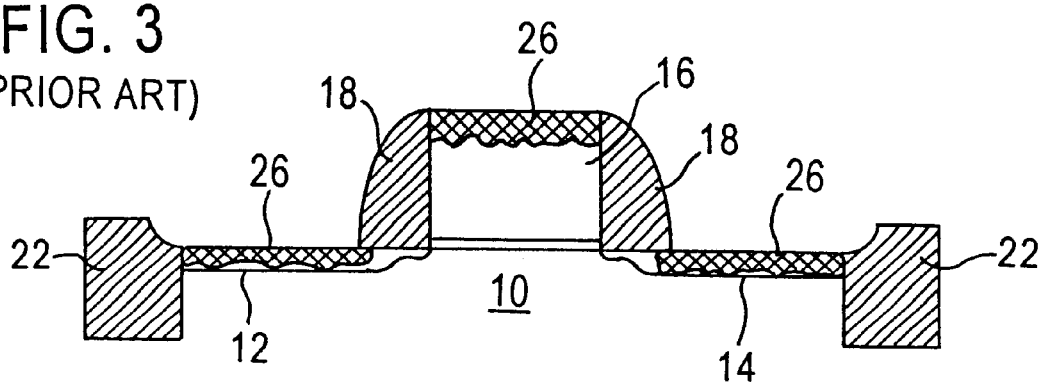
FIG. 3 is a cross-section of the semiconductor wafer of FIG. 2 following a second rapid thermal annealing step to form lower resistivity metal silicide regions in accordance with the prior art.
Figure 4:
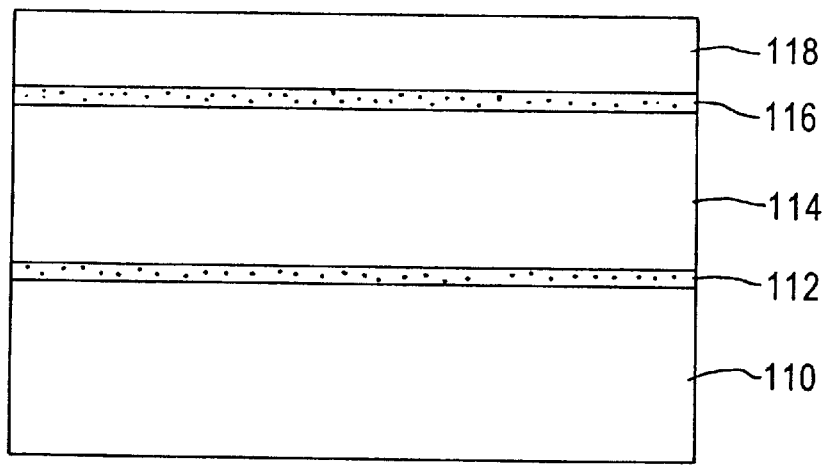
FIG. 4 is a cross-section of a portion of a semiconductor wafer prior to a salicidation process in accordance with certain embodiments of the present invention.

FIG. 4 depicts the semiconductor wafer prior to the etching of a gate in accordance with an embodiment of the present invention. A silicon substrate 110 is provided, with a gate oxide 112 having been grown on the substrate 110. The material which will form the gate, such as polysilicon, is deposited on the layer 114. Following the deposition of the polysilicon layer 114, a pad oxide layer 116 is formed on the polysilicon layer 114.

A polish stop layer 118, formed for example from nitride, is deposited on the pad oxide layer 116. The thickness of the polish stop layer 118 should be sufficient to serve as a polish stop during a chemical-mechanical polishing, for example. Although nitride is a suitable polish stop, other materials may be used as long as they provide a suitable etch selectivity and exhibit sufficient polish stop characteristics.

Figure 5:
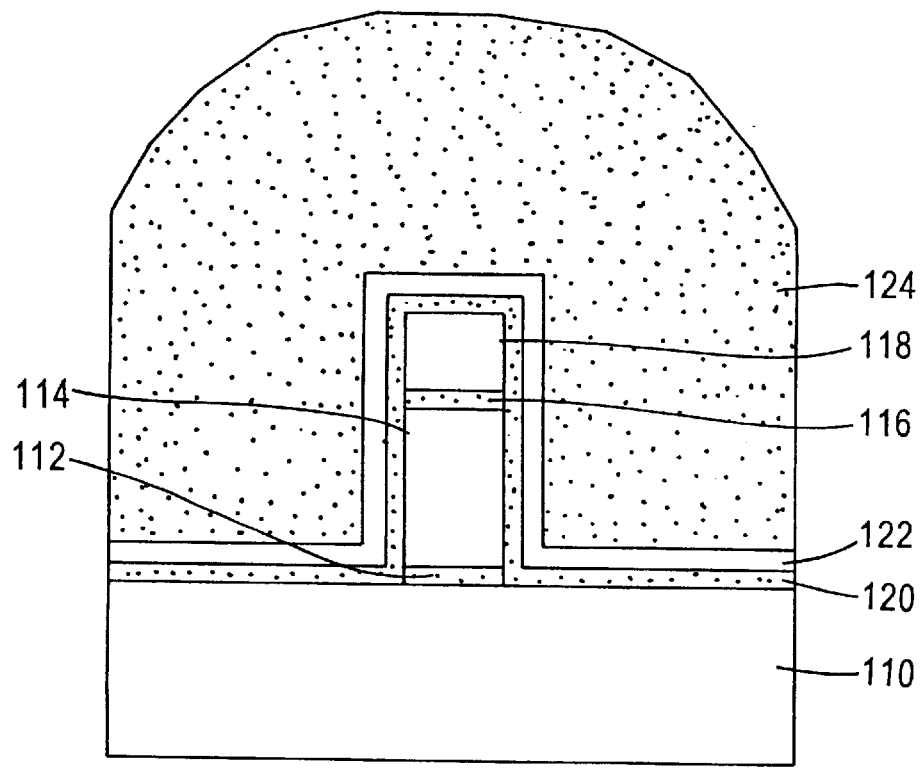
FIG. 5 is a depiction of the semiconductor wafer of FIG. 4, following the etching of a gate structure and the deposition of a plurality of layers over the etched gate.

FIG. 5 depicts the semiconductor wafer of FIG. 4 after the gate has been etched and the plurality of layers have been deposited. The etching of the gate may be performed anisotropically to create a stack containing the gate oxide 112, the polysilicon 114, the pad oxide 116, and the polish stop 118.

Following the etching of the gate stack, a thin oxide layer 120 is conformally deposited over the gate stack. The oxide layer 120 may be approximately 100 Angstroms, for example. After the deposition of the oxide layer 120, a relatively thin nitride layer 122 (e.g. approximately 100 Angstroms) is conformally deposited over the thin oxide layer 120. The thin nitride layer 122 will serve in later processing steps as an etch stop layer. A thick oxide layer 124 is then deposited conformally over the thin nitride layer 122. As will be seen in later figures and description, the thick oxide layer 124 serves as a shield against formation of silicide on the source/drain areas during the formation of silicide on the gate.

Figure 6:
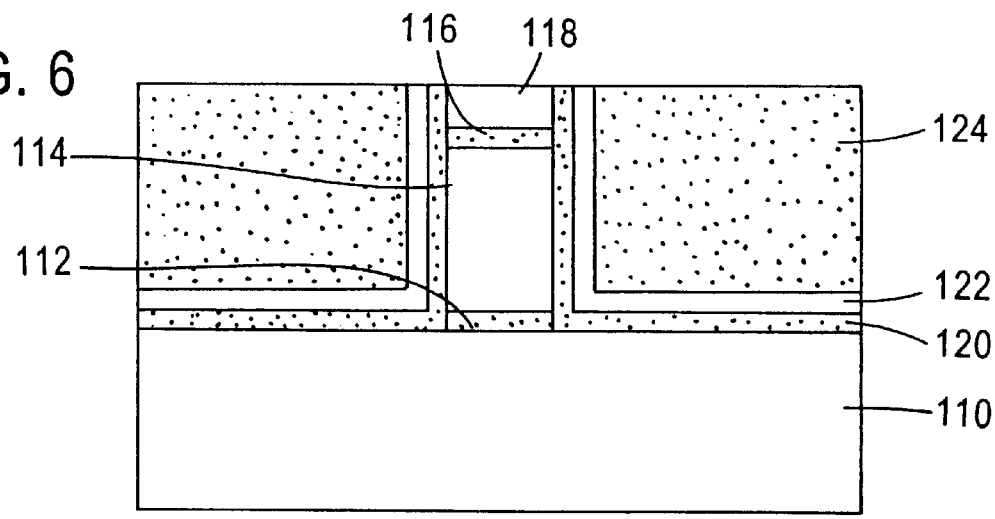
FIG. 6 depicts the semiconductor wafer of FIG. 5 after a polishing process.

A polishing operation is then performed, resulting in the structure of FIG. 6. The polishing may be a chemical-mechanical polishing in accordance with conventional techniques. The chemical-mechanical polishing is performed until the polish stop layer 118 is reached. This process creates a planarized surface and removes from over the gate the thick oxide 124, the thin nitride layer 122, and the thin oxide layer 120.

Figure 7:
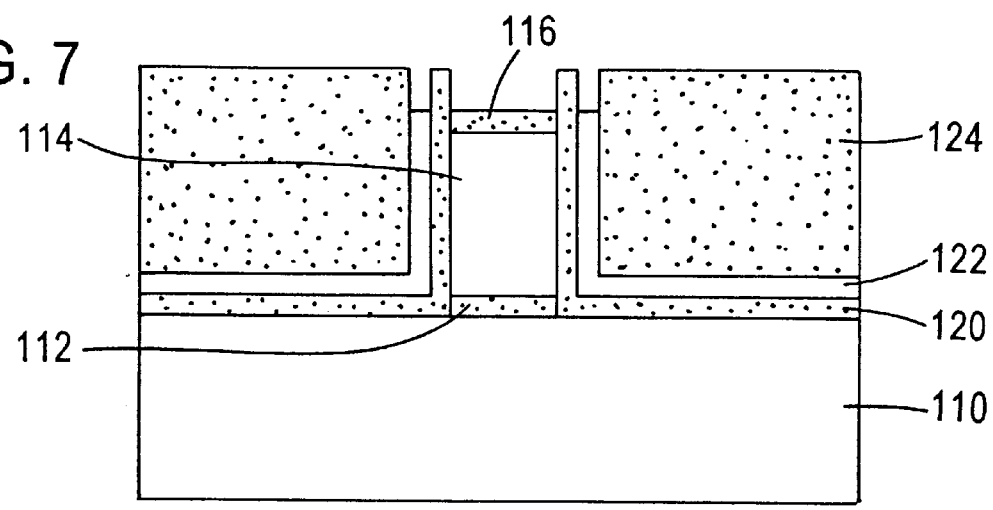
FIG. 7 depicts the semiconductor wafer of FIG. 6 after an etching of a polish stop layer.

A wet etch is then performed on the structure of FIG. 6, resulting in the structure of FIG. 7. The etch includes, for example, a hot phosphoric etching that removes the nitride in the polish stop layer 118. Some of the nitride in the thin nitride layer 122 is also removed during this process.

Figure 8:
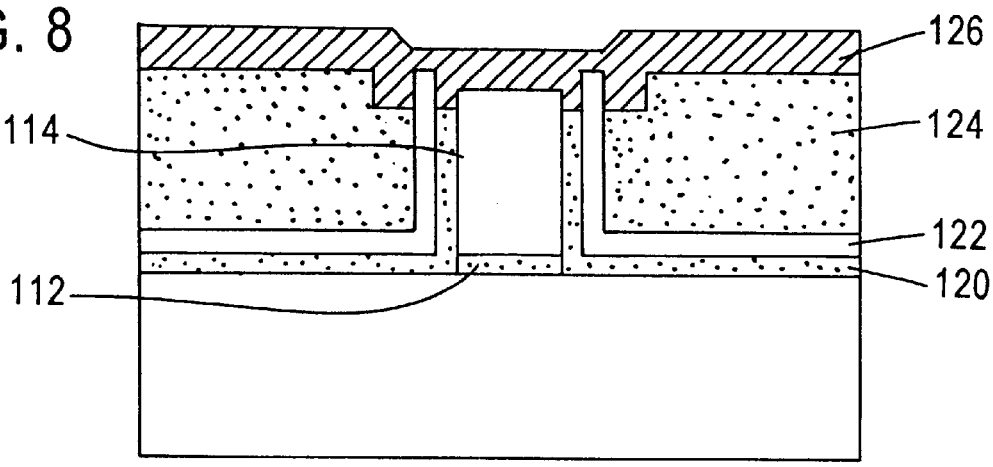
FIG. 8 depicts the semiconductor wafer of FIG. 7 following further etching and the deposition of a refractory metal layer.

Using HF chemistry, for example, the oxide over the polysilicon is etched. This includes the pad oxide 116 and the oxide contained in the thin oxide layer 120. Although an isotropic etch is shown, resulting in the structure of FIG. 8, an anisotropic etch, such as reactive ion etching, could also be used.

Following the etching of the oxide in the gate region, resulting in the exposure of the polysilicon 114 of the gate, a refractory metal layer 126 is deposited on the structure. The refractory metal in layer 126 only contacts the gate portion of the semiconductor device. Areas in which the source/drain regions will be formed are shielded from the refractory metal by the oxide 124, as well as the thin nitride layer 122 and the thin oxide layer 120. The layer of refractory metal 126 may be deposited using physical vapor deposition from an ultra-pure sputtering target and a commercially available ultra-high vacuum, multi-chamber, DC magnetron sputtering system. In certain preferred embodiments, the metal is cobalt (Co). Cobalt has a number of advantages over other types of metals. For example, in comparison to cobalt, titanium silicide sheet resistance rises dramatically due to narrow-line defects. Since a low resistivity phase of cobalt silicide forms by a diffusion reaction rather than a nucleation-and-growth as in the low resistivity phase of titanium silicide, cobalt silicide has been introduced by several integrated circuit manufacturers as the replacement for titanium. However, the use of cobalt in refractory metal layer 126 is exemplary only. Other types of refractory metals, such as titanium, nickel, platinum and palladium, may be also used.

Figure 9:
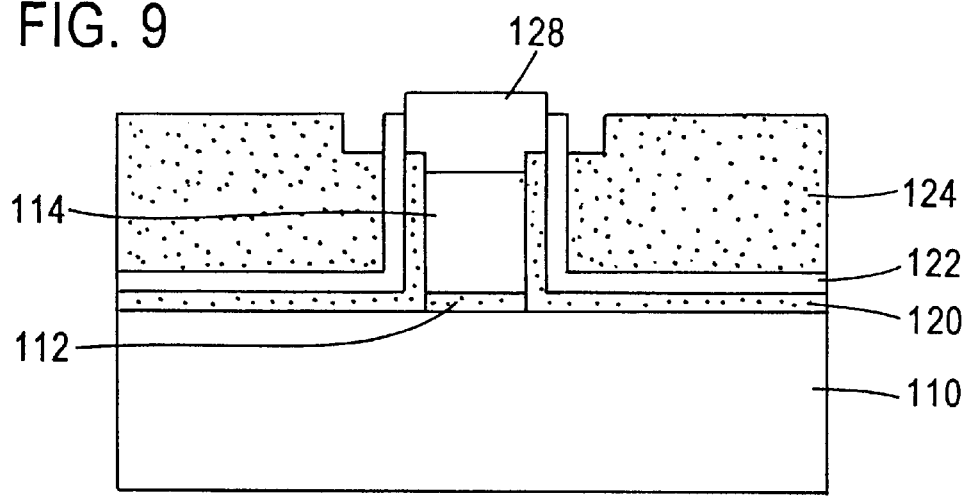
FIG. 9 depicts the semiconductor wafer of FIG. 8 after the reaction of the refractory metal layer to form silicide on the gate and removal of unreacted refractory metal.

The silicide is formed as depicted in FIG. 9, by one or more rapid thermal anneal steps. Silicide region 128 is formed on top of the polysilicon gate 114. A first rapid thermal anneal step that may be performed by exposing the semiconductor wafer to a temperature between about 415° C. and about 600° C. for a relatively short time, for example between about 5 and 90 seconds. Some of the polysilicon in the gate 114 is consumed during the first rapid thermal anneal step to become part of the silicide region 128. A second rapid thermal anneal step could be performed immediately to form the lower resistivity phase of the silicide. Typically, the formation of the lower resistivity phase silicide is performed at a higher temperature during the second rapid thermal anneal step. For example, the temperature may be between about 600° C. and about 850° C., with exposure to this high temperature for between about 5 and about 90 seconds. During this second rapid thermal anneal step, the higher resistivity monosilicide (e.g., CoSi) is converted to lower resistivity disilicide (e.g., $CoSi_2$), when cobalt is the refractory metal.

The unreacted refractory metal in the refractory metal layer 126 is removed by a selective etch. A typical etchant employed to remove unreacted cobalt is $3HCl:H_2O_2$. Removal of the unreacted metal by the peroxide solution leaves the silicide region 128 on the gate 114 intact. The resultant structure is depicted in FIG. 9.

Figure 10:
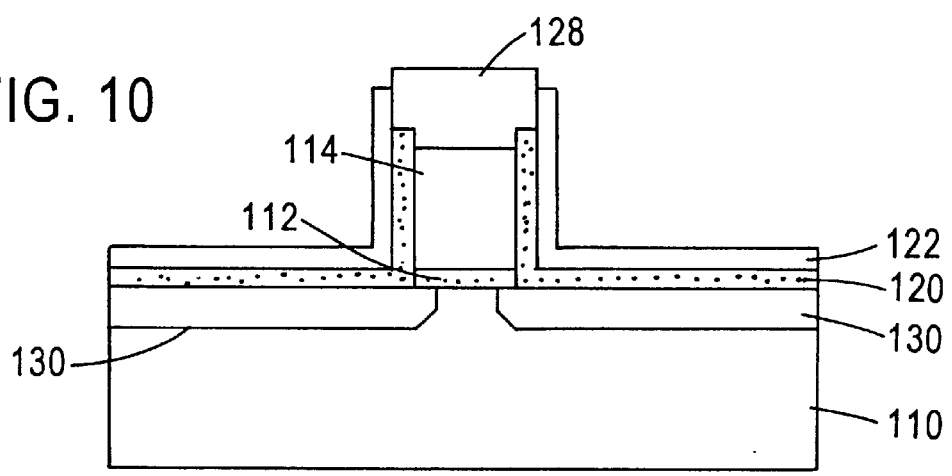
FIG. 10 depicts the semiconductor wafer of FIG. 9 following the removal of a layer and implantation of the source/drain extension.

Following the formation of the silicide region 128 on the polysilicon 114 of the gate, the shielding material (the oxide 124) may be removed. This can be accomplished with a conventional wet etch chemistry that etches the oxide 124 until the thin nitride layer 122 is reached. The thin nitride layer 122 serves as an etch stop layer. In certain embodiments, the thin nitride layer 122 is left in place and a source/drain extension implant is performed, as schematically depicted by reference numeral 130. In other embodiments of the invention, the thin nitride layer 122 is removed following the etching of the thick oxide, and the source/drain extension implant is performed after the thin nitride layer 122 is removed. The resulting structure is depicted in FIG. 10.

Figure 11:
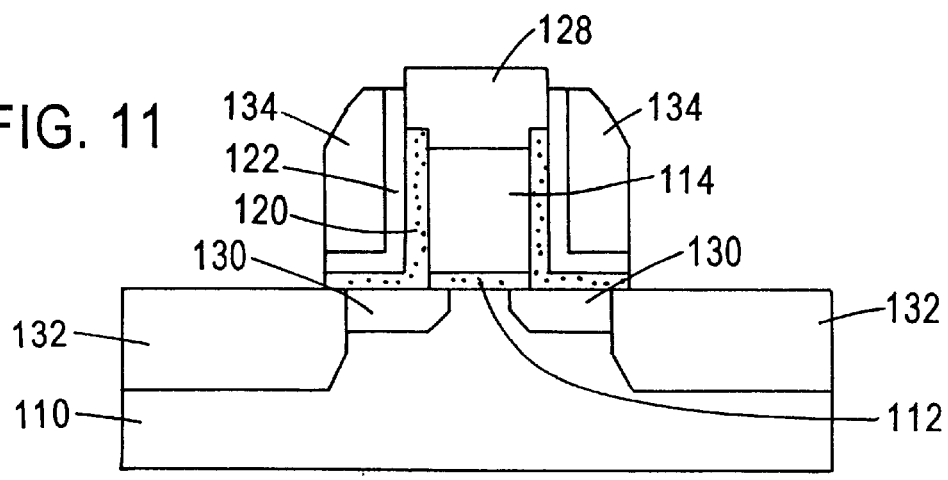
FIG. 11 depicts the semiconductor wafer of FIG. 10 following the deposition of a spacer layer, the etching of the spacer, and formation of the source/drain through implantation and activation of dopants.

A spacer material, such as oxide or nitride, is conformally deposited over the semiconductor wafer. The wafer is then anisotropically etched to form sidewall spacers 134 on the sidewalls of the gate 114. In between the polysilicon 114 of the gate and the sidewall spacers 134, portions of the thin oxide layer 120 and the thin nitride layer 122 may be present. The anisotropic etching, such as a reactive ion etching, for example, removes the nitride layer 122 and the oxide layer 120. A source/drain implant is then performed to form the source/drain areas 132. A rapid thermal annealing can then be performed which activates the dopants that have been implanted. The resulting structure is depicted in FIG. 11.

Figure 12:
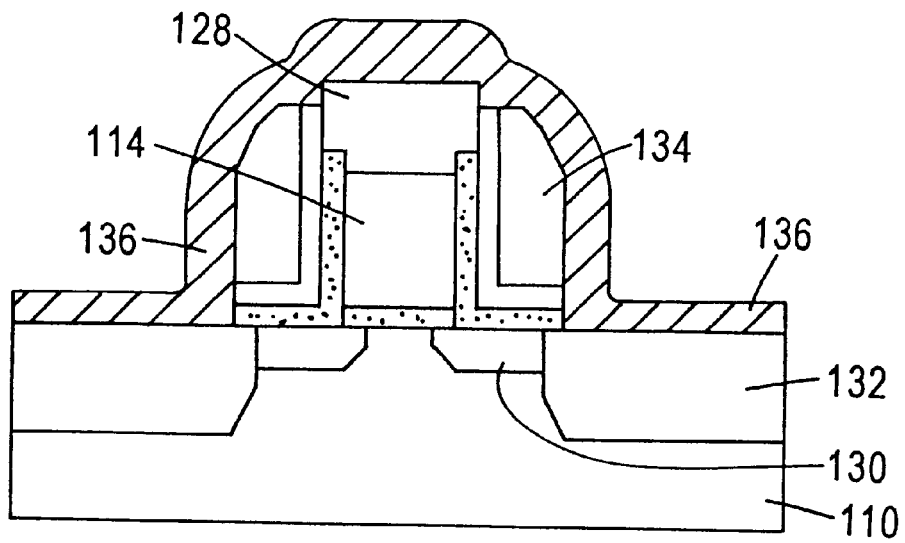
FIG. 12 depicts the semiconductor wafer of FIG. 11 after a refractory metal layer has been deposited.

Following the implantation and the creation of the source/drains 132, a refractory metal layer 136 is conformally deposited over the semiconductor wafer. The refractory metal layer 136 is preferably the same refractory metal that was used in forming the silicide region 128. As shown in FIG. 12, the refractory metal layer 136 overlays and contacts the source/drains 132 in the previously formed silicide region 128 on the gate polysilicon 114.

One or more rapid thermal anneal steps are performed to produce the low resistivity metal silicide regions 135 above the source/drains 132 as well as to thicken the silicide region of the gate 114. A thicker silicide region 138 is thereby produced above the gate 114.

Figure 13:
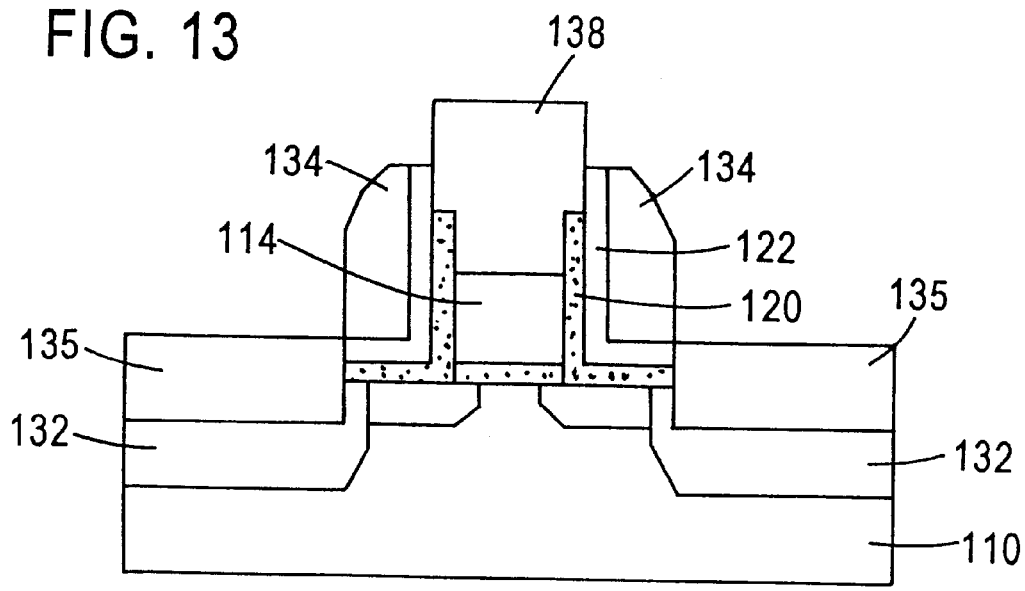
FIG. 13 depicts the semiconductor wafer of FIG. 12 following the reaction of the cobalt to form the dual silicide on the source/drain areas and the additional silicide on the previously formed silicide region on the gate, and the removal of the unreacted refractory metal.

As is apparent from FIG. 13, a thicker silicide region 138, formed in separate silicide processes, is formed on the gate 114. This lowers the gate resistance in the semiconductor device. At the same time, excessive consumption of the silicon and in the source/drains and bridging of the silicide over the gate and the source/drains is prevented which might otherwise occur when only a single silicide process is performed to create the gate silicide region 138 and the source/drains silicide regions 135.

Although the present invention has been described and illustrated in detail, it is to be clearly understood that the same is by way of illustration and example only and is not to be taken by way of limitation, the scope of the present being limited only by the terms of the appended claims.

What is claimed is:

1. A method of reducing gate resistance in a semiconductor device, comprising:
    initially forming a silicide region only on a gate of a semiconductor device such that a source/drain remains free of silicide on the source/drain; and
    subsequently forming silicide on the source/drain of the semiconductor device and on the previously formed silicide region.

2. The method of claim 1, further comprising forming a stack of a gate, a pad oxide and a nitride polish stop prior to forming the silicide region.

3. The method of claim 2, further comprising:
    conformally depositing a first oxide layer over the stack,
    conformally depositing a nitride layer on the first oxide layer; and
    conformally depositing a second oxide layer on the nitride layer.

4. The method of claim 3, further comprising polishing the second oxide layer, the nitride layer and the first oxide layer and stopping the polishing on the nitride polish stop.

5. The method of claim 4, further comprising: removing the nitride polish stop and the first oxide layer on the stack to expose a surface of the gate; depositing a refractory metal layer over the gate; and annealing to form the silicide region on the gate.

6. The method of claim 5, further comprising removing the first oxide layer; performing a source/drain extension implant; forming spacers on sidewalls of the gate; performing a source/drain implant; and activating the dopants.

7. The method of claim 6, wherein the step of forming silicide on a source/drain includes depositing a refractory metal layer over the source/drain and the silicide region of the semiconductor device; and annealing to form the silicide region on the source/drain and increase the thickness of the silicide region on the gate.

8. The method of claim 1, wherein the step of forming a silicide region only on a gate includes exposing only a surface of the gate of the semiconductor device such that other portions of the semiconductor device are not exposed.

9. The method of claim 8, wherein the step of forming a silicide region only on a gate includes depositing a refractory metal on the exposed surface of the gate and annealing to form the silicide region.

10. The method of claim 9, wherein the step of forming silicide on a source/drain includes exposing the other portions of the semiconductor device, depositing a refractory metal on the exposed portions of the semiconductor device and the silicide region, and annealing to form silicide on the exposed portions of the semiconductor device and on the silicide regions.

11. A method of reducing gate resistance in a semiconductor device, comprising:
   forming a gate;
   forming silicide to a first thickness on the gate and simultaneously preventing silicide formation on the other portions of the semiconductor device; and
   increasing the thickness of the silicide on the gate to a second thickness and simultaneously forming silicide on at least some of the other portions of the semiconductor device.

12. The method of claim 11, wherein the step of preventing silicide formation includes exposing only the gate of the semiconductor device to a refractory metal and subsequent annealing.

13. The method of claim 12, wherein the steps of increasing the thickness of the silicide and simultaneously forming silicide includes exposing at least some of the other portions of the semiconductor device and the previously formed silicide to a refractory metal and subsequent annealing.

14. The method of claim 13, wherein the step of preventing silicide formation includes completely covering the other portions of the semiconductor device with a sacrificial material.

15. The method of claim 14, wherein the step of exposing at least some of the other portions of the semiconductor device includes removing the sacrificial material.

16. The method of claim 15, wherein the sacrificial material is an oxide.

* * * * *